(12) United States Patent
Giraudet

(10) Patent No.: US 6,991,151 B2
(45) Date of Patent: Jan. 31, 2006

(54) METHOD OF FABRICATING AN ELECTRONIC MODULE COMPRISING AN ACTIVE COMPONENT ON A BASE

(75) Inventor: Louis Giraudet, Reims (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/712,357

(22) Filed: Nov. 14, 2003

(65) Prior Publication Data
US 2004/0108363 A1    Jun. 10, 2004

(30) Foreign Application Priority Data
Dec. 5, 2002   (FR)   .................................. 02 15331

(51) Int. Cl.
*B23K 31/02*   (2006.01)
(52) U.S. Cl. .................. 228/180.21; 361/767; 228/193
(58) Field of Classification Search ........... 228/180.21, 228/110.1, 234.1, 245, 247, 248.5, 195, 193, 228/180.22; 361/767, 803, 760, 761; 174/263; 257/737, 738
See application file for complete search history.

(56) References Cited

U.S. PATENT DOCUMENTS 3,670,396 A * 6/1972 Lindberg ................... 228/106
5,478,778 A   12/1995 Tanisawa
6,013,948 A * 1/2000 Akram et al. ............... 257/698
2002/0071642 A1  6/2002 Nakata

FOREIGN PATENT DOCUMENTS

DE    42 26 167 A1   2/1994
JP    2002-334902 A  11/2002

OTHER PUBLICATIONS

DeMiguel S et al: "Low-cost, polarization independent, tapered photodiodes with bandwidth over 50 GHz" Electronic Letters, IEE Stevenage, GB, vol. 37, No. 8, Apr. 12, 2001 pp. 516-518, XP 006016458.

* cited by examiner

*Primary Examiner*—Jonathan Johnson
(74) *Attorney, Agent, or Firm*—Sughrue Mion, PLLC

(57) ABSTRACT

To reduce the capacitance of an electronic module having an active component (1) bonded to a base (2), thereby enabling its cutoff frequency to be raised, the method provides a plurality of contact pads (P1, P'1, P2, P3, P'3) and a plurality of contact zones (Z1, Z'1, Z2, Z3, Z'3) on the component and on the base respectively. First structures (P1, P'1, Z1, Z'1) are adapted to be bonded together by melting solder. Second structures (P2, Z2) of small surface area are designed to be bonded together by thermal compression delivered by the mutual force of attraction that results between the component and the base due to the solder melting. The invention is particularly applicable to making optoelectronic components used in high data rate optical transmission systems.

10 Claims, 1 Drawing Sheet

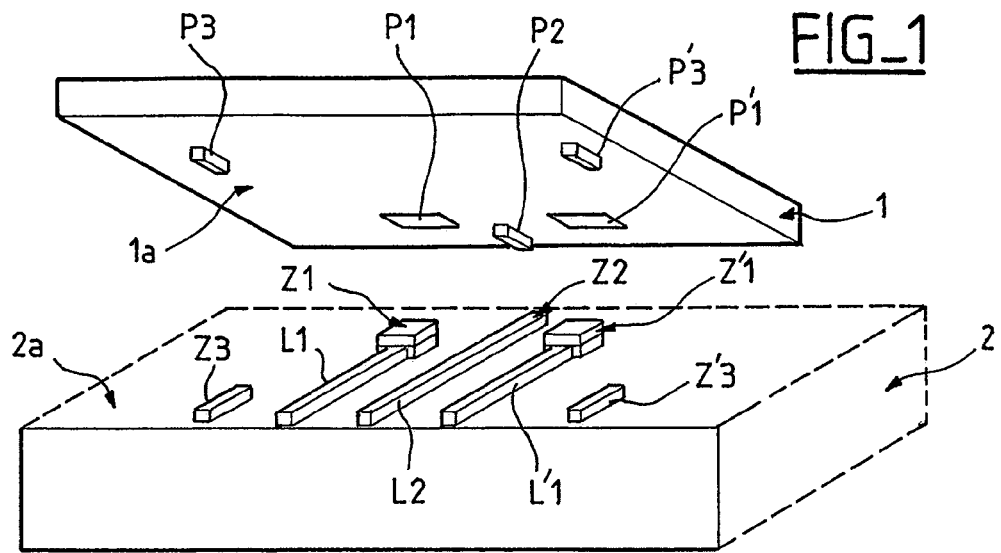
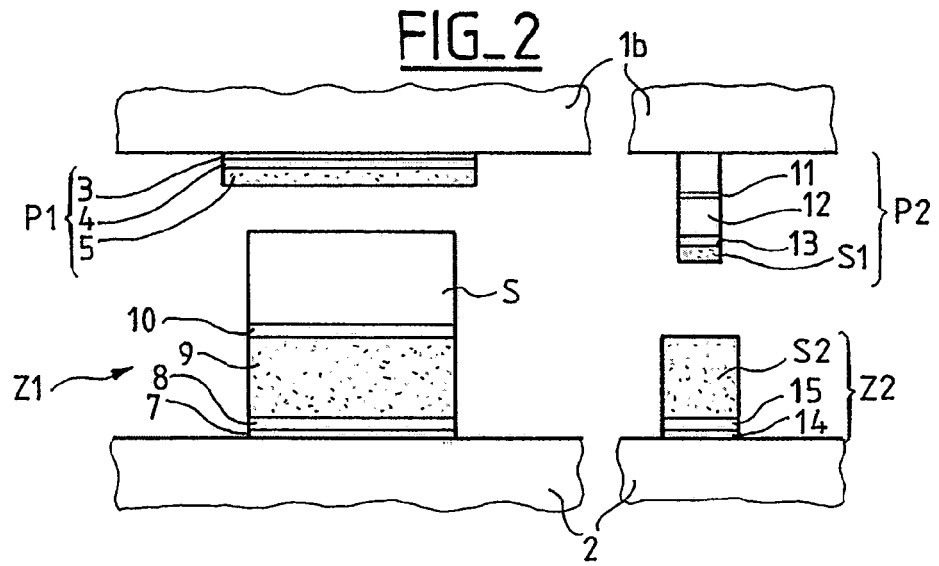
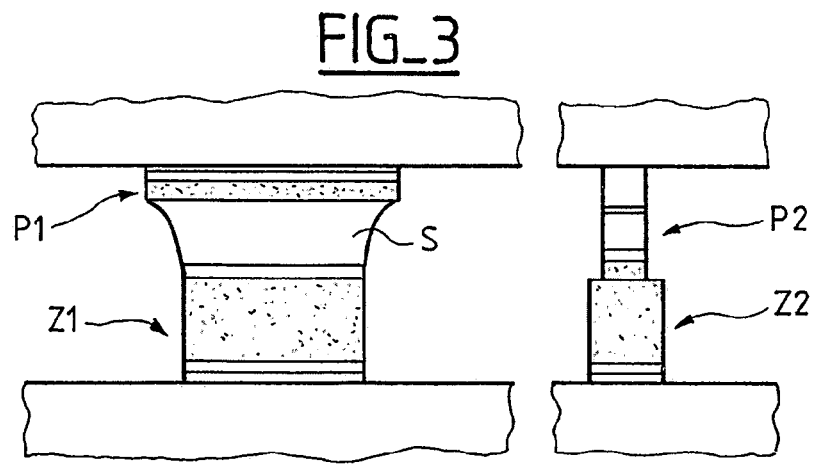

METHOD OF FABRICATING AN ELECTRONIC MODULE COMPRISING AN ACTIVE COMPONENT ON A BASE

The invention lies in the field of electronic or optoelectronic devices intended to operate at very high frequency.

Such devices are used in particular in high data rate transmission systems, for example operating at about 10 gigabits per second (Gbit/s) or more. Many such devices are made in the form of modules which require active components, often monolithic components (chips) to be mounted on bases (also known as "substrates"). The base serves both as a mechanical support and as an electrical interface for feeding electricity to the active component(s) and for delivering or extracting electrical signals thereto or therefrom.

By way of example, in optical transmission systems, the optoelectronic components concerned are typically electro-absorption electro-optical modulators, photodetectors (photodiodes), or indeed laser sources with direct modulation control. Purely electronic active components are also concerned such as transistors or integrated circuits which are used in the associated microwave electronic circuits. Below, the invention is set out more particularly by describing photodiodes, even though the invention also applies to numerous other types of component, and in particular to those mentioned above.

The maximum operating frequency of such devices depends firstly on the technology and the design of the components used. However it also depends to a large extent on the way in which connections are made between the components and the bases on which they are mounted.

One type of mounting that provides particularly high performance from this point of view is the so-called "flip-chip" mounting technique in which all or some of the electrodes of a chip constituting the component are placed on the same face so as to be capable of being connected without wiring to corresponding contact zones on the base. The electrodes of the chip are in the form of contact pads and they are soldered directly to the contact zones of the base using a solder material, for example a gold/tin (AuSn) alloy covering the contact zones.

The method enabling such mounting to be performed consists initially in providing, on one face of the chip and on one face of the base, corresponding pads and contact zones that are positioned so as to coincide when these faces are brought face to face. Each of the contact zones on the base has a quantity of solder material on its surface. In addition, the faces of the chip and of the base are generally provided with horizontal positioning abutments serving during mounting to cause the corresponding contact pads and contact zones to coincide accurately (the so-called "self-alignment" method). Vertical positioning abutments are also provided on the chip and on the base. With optoelectronic devices, it is important for these abutments to be made accurately in order to enable the component to be properly coupled optically with other optical elements mounted on or bearing against the base.

In order to perform mounting, the chip is placed so that its contact pads face respective corresponding contact zones of the base. Thereafter the assembly is heated one or more times to a temperature which is high enough to melt the solder material which then wets the surfaces of the contact pads of the chip. By appropriately selecting the contact materials, the dimensions of the contact zones on the base and of the contact pads on the chip, and also by appropriately selecting the volumes of solder, it can be ensured that on being melted the solder spreads, thereby creating a resultant force of attraction between the chip and the base. One of the particular conditions for obtaining a force of attraction between a contact pad on the chip and a contact zone on the base is that the area of the contact pad is greater than the area of the contact zone.

Under such conditions, this melting step ensures that the horizontal and vertical positioning abutments of the chip are pressed against the corresponding abutments of the base.

Thus, the positioning and the mechanical fixing of the chip on the base, and the provision of electrical interconnections between the chip and the base are all performed simultaneously during the same melting step.

Because there is no wiring, the cutoff frequency of a module obtained by the above-outlined flip-chip mounting technique is limited mainly by its equivalent capacitance. With photodiodes, by way of example, this technique has enabled modules to be made having a cutoff frequency greater than 10 gigahertz (GHz) and thus capable of detecting a signal at a data rate of 10 Gbit/s.

In order to achieve even higher data rates, photodiodes can be made that are capable of operating at above 40 Gbit/s by using structures that present low intrinsic capacitance. For this purpose, it is necessary to reduce the area of the active portion and also the area of at least one of the electrodes through which the modulated electrical signal passes. For optimum dimensioning, it is appropriate for this electrode to have dimensions that are analogous to those of the active portion. This observation applies equally well to any type of component that is intended for operation at very high frequency.

Thus, with a photodiode, operation at 40 Gbit/s requires an active area and thus an electrode area that does not exceed 100 square micrometers ($\mu m^2$). Unfortunately, with the above-described "flip-chip" mounting method making use of molten solder, the dimensions of the contact pads on the chip and of the contact zones on the base are difficult to reduce to below about 30 micrometers ($\mu m$). In addition, contact pads and contact zones of small area lead to the force of attraction between the chip and the base being limited. That method is therefore not suitable for mounting components provided with the very small electrodes that are compatible with operating at frequencies significantly higher than 10 GHz.

In order to escape from this limitation, it is possible to envisage using other methods for bonding electrodes of small area.

This applies in particular to the method of bonding by thermal compression. In outline, that method serves to bond metal elements of suitable composition by achieving metal-metal diffusion by establishing prolonged contact under pressure between said elements at a temperature that is relatively high, but lower than the melting temperatures of the metals or alloys used. The absence of melting enables particularly small contact points to be formed that are of dimensions which can be controlled accurately. The metal which is most suitable for thermal compression bonding is gold, however other metals can be used, for example aluminum, copper, and alloys of these metals.

In order to assemble a chip on a base by thermal compression, while remaining in the above-described flip-chip configuration, it is necessary initially to provide metal layers of compositions that are suited to the method, typically of gold, on all of the contact pads of the chip and on all of the contact zones of the base. Thereafter the chip should be placed on the base so as to put the metal layers on the chip into contact with the corresponding layers on the base. The assembly is then heated while simultaneously applying force to compress the metal layers of the contact pads on the chip against the corresponding layers on the base during a determined length of time.

Compared with the conventional method, the thermal compression method as described above nevertheless presents drawbacks in that it does not make it possible to benefit from the advantages of self-alignment, and in that the resulting assembly is of limited mechanical strength.

An object of the invention is simultaneously to remedy the operating frequency limitations inherent to the conventional flip-chip method of mounting using solder and to escape from the drawbacks of the method by thermal compression.

To this end, the invention provides a method of fabricating an electronic or optoelectronic module comprising an active component mounted on a base, a face of the component being provided with a plurality of contact pads designed to co-operate with corresponding contact zones disposed on a face of the base, at least one contact pad of the component having a first vertical contact pad structure being designed to be capable of being bonded by means of a first bonding material to a corresponding contact zone of the base that has a first vertical contact zone structure, the method being characterized in that it consists:

in designing said component and said base in such a manner that at least one other contact pad of the component having an electrical function has a second vertical contact pad structure and is designed to be bonded to a corresponding contact zone of the base having a second vertical contact zone structure, the contact pad(s) and the contact zone(s) having said second vertical contact pad and contact zone structures respectively being coated in second bonding materials each having a melting temperature higher than the melting temperature of the first bonding material, said second materials being suitable for being bonded together directly by thermal compression at an assembly temperature lying between the melting temperature of the first bonding material and the melting temperatures of the second bonding materials, the contact pad(s) and the contact zone(s) having the first vertical contact pad and contact zone structures respectively being of dimensions such that, when they are bonded together by melting said first bonding material at said assembly temperature, a mutual force of attraction results between the component and the base suitable for bonding together the contact pad(s) and the contact zone(s) respectively having the second vertical contact pad and contact zone structures by thermal compression;

in pressing the component against the base by placing said contact pads and said corresponding contact zones respectively face to face; and by heating the component and the base to said assembly temperature.

Thus, the invention takes advantage of the observation that the minimum pressure that needs to be exerted in order to perform bonding by thermal compression between some of the contact zones on the base and the corresponding contact pads of the component in fact requires a resultant force that can easily be exceeded by the resultant of the attraction forces that can be exerted by other contact zones of the base carrying solder on corresponding contact pads of the component.

It may be observed that the contact pads and contact zones designed to be bonded together by thermal compression normally have an electrical function, but that they also have a function of vertically positioning the component relative to the base. Thus, for components provided with at least three contact pads for bonding together by thermal compression, it is possible for the contact pads alone to suffice in achieving vertical positioning. However, if the number of contact pads is not sufficient, then additional positioning abutments should be provided. Under such circumstances, it is advantageous for the abutments to have the same structure as the pads that act as electrical contacts since the pads having an electrical function and the pads having a purely mechanical function can all be made during a common step in the fabrication of the component. The same applies to the corresponding zones of the base.

In an implementation that is particularly adapted to the case where the number of component pads having an electrical function is small, at least one other pad and one other corresponding zone having respective second contact pad structures and second contact zone structures serve solely to provide a function of positioning the components relative to the base.

Under such circumstances, the pads having second contact pad structures advantageously present identical contact areas. This disposition serves to avoid differences in mechanical behavior between different kinds of pad and zone while they are being bonded together. This results in better stability for the component relative to the base and reduces the risk of applying stresses to the chip.

In general, in order to obtain low capacitance, it is not necessary for all of the electrodes of a component to be of small area. For example, with a ridge structure p-i-n type photodiode, small capacitance requires a small area for the active layer which determines the area of the ridge. However to conserve small capacitance after electrodes have been added, it is sufficient for only the electrode overlying the ridge portion to be of dimensions analogous to those of said portion. The other electrodes can be of larger dimensions thus enabling them to be bonded in conventional manner, i.e. by means of the first bonding material. In some cases, it is therefore possible to implement the method of the invention by means of contact pads and corresponding contact zones having respective first contact pad and contact zone structures, these contact pads and contact zones each performing an electrical function.

In other cases, and in a particular implementation of the invention, at least one pad and one corresponding zone are provided having respective first contact pad and contact zone structures and serving solely to provide a mutual attraction function between the component and the base.

The invention also provides an electronic or optoelectronic module obtained by the above-defined method.

More precisely, the invention also provides an electronic or optoelectronic module comprising an active component mounted on a base, one face of the component being provided with a plurality of contact pads co-operating with corresponding contact zones disposed on one face of the base, at least one contact pad of the component having a first vertical contact pad structure being bonded by means of a first bonding material to a corresponding contact zone of the base having a first vertical contact zone structure, the module being characterized in that at least one other contact pad of the component having an electrical function has a second vertical contact pad structure and is bonded to a corresponding contact zone of the base having a second vertical contact zone structure, the contact pad(s) and the contact zone(s) having respectively said second vertical contact pad and contact zone structures being coated with respective second bonding materials each having a melting temperature higher than the melting temperature of the first bonding material, the second materials being suitable for being bonded together directly by thermal compression at an assembly temperature lying between the melting temperature of the first bonding material and the melting temperatures of the second bonding materials, the contact pad(s) and the contact zone(s) respectively having the first vertical contact pad and contact zone structures having dimensions such that, when they are bonded together by melting said first bonding material at said assembly temperature, a mutual force of attraction results between the component and the base which causes the contact pad(s) and the contact zone(s) respectively having the second vertical contact pad and contact zone structures to be bonded together by thermal compression.

Other aspects and advantages of the invention appear in the description below given with reference to the figures, in which:

FIG. 1 is a diagram showing an example of a component placed above a base prior to components being assembled on the base using the method of the invention;

FIG. 2 is a diagram showing the vertical contact pad and contact zone structures of the component and of the base of FIG. 1; and FIG. 3 shows the same elements after they have been assembled together using the method of the invention.

The method of the invention is illustrated for the particular case where the component is a high data rate photodiode. For reasons of clarity, the proportions of the dimensions are not complied with in the figures, however values for dimensions that are genuinely applicable to this example are specified at the end of the present description.

FIG. 1 is a perspective diagram showing a photodiode 1 placed above a portion of a base 2 prior to being assembled thereto in order to form a module.

The face 1a of the photodiode 1 is placed facing the face 2a of the base, and the dispositions of the various contact pads and contact zones involved in the method of the invention can be seen. FIG. 2 shows their structures in greater detail. Using a convention that is commonplace when describing the various structures involved, the direction referred to as "vertical" is the direction perpendicular to the epitaxial layers of the component and to the faces 1a and 2a of the component and of the base which are assumed to be parallel.

By way of example, the photodiode 1 is made on an InP substrate with an epitaxial layer 1b of n-doped InP having formed thereon a conventional active p-i-n structure defined in a projecting portion commonly referred to as a "ridge". As shown in FIG. 2, the p-i-n structure is formed essentially by the layer 1b, an active layer 11, and a layer 12 of p-doped InP.

Electrical connections are made by means of two contact pads P1, P'1 placed on the layer 1b on either side of the ridge, and by means of an electrode placed on the layer 12 of the ridge. This electrode is constituted by layers of metallization 13 and S1 respectively constituted by platinum and by gold, for example. The contact pads P1, P'1 are formed on the layer 1b and comprise in succession: a layer 3 of titanium; a layer 4 of platinum; and a layer 5 of gold.

The layers 3, 4, and 5 of the contact pads P1, P'1 constitute a first vertical contact pad structure designed for bonding by melting solder. The ridge covered by the layers 13 and S1 constitutes another contact pad given reference P2 and having a second vertical contact pad structure designed for bonding by thermal compression.

Since the photodiode 1 possesses only a single contact pad P2 that has an electrical function and that is designed for bonding by thermal compression, two additional pads P3 and P'3 are provided to act as vertical positioning abutments. The pads P3 and P'3 have the same vertical structure and the same horizontal dimensions as the contact pad P2, but they do not have any electrical function. Thus, the three pads P2, P3, and P'3 constitute three abutments disposed in a triangle so as to ensure that the component is stable on the base.

By way of example, the base 2 is made of an insulating material such as alumina. Its face 2a is provided with zones Z1, Z'1, Z2, Z3, and Z'3 corresponding respectively to the pads P1, P'1, P2, P3, and P'3 of the component 1. These zones are placed so as to face the respective corresponding pads of the component when the face 1a of the component is pressed against the face 2a of the base.

The zones may carry first or second vertical structures corresponding respectively to the first and second vertical contact pad structures described above.

The first vertical structure is that of the contact zone Z1 shown in FIG. 2. The contact zones Z1 and Z'1 are identical in structure and they are designed to be bonded to the contact pads P1 and P'1 respectively by melting solder.

In the example shown, the contact zones Z1 and Z'1 are constituted in succession, starting from the base 2: by a layer 7 of titanium; a layer 8 of platinum; a layer 9 of gold; a second layer 10 of titanium; and a layer S of alloy based on gold and tin.

The second vertical structure shown in FIG. 2 is that of the contact zone Z2. The zones Z2, Z3, and Z'3 are identical in structure and they are designed to be bonded to the pads P2, P3, and P'3 respectively by thermal compression.

In the example shown, the zones Z2, Z3, and Z'3 are formed in succession, starting from the base 2: by a layer 14 of titanium; a layer 15 of platinum; and a layer S2 of gold. These three layers 14, 15, and S2 define a second vertical contact zone structure and they have advantageously the same compositions and thicknesses respectively as the three layers 7, 8, and 9 of the first contact zone structure so as to make it possible for both structures to be deposited during common fabrication steps.

The contact zones Z1, Z'1, and Z2 of the base which correspond respectively to the contact pads P1, P'1, and P2 have an electrical function and are consequently connected to three electrical tracks L1, L'1, and L2 respectively which are deposited on the base, as can be seen in FIG. 1. The vertical structure of these tracks is advantageously identical to that of the second-structure zones Z2, Z3, and Z'3 since they can then be deposited during the same fabrication step.

The various thicknesses of the layers specified above are selected to comply with the following criteria. The layers of titanium or of platinum are conventional anti-diffusion and bonding layers of small thickness, typically in the range 0.05 $\mu$m to 0.2 $\mu$m. The thickness of the layer S1 needs to be sufficient to enable thermal compression to be performed, e.g. it is equal to 0.25 $\mu$m. The thicknesses of the layers 5, 9, and S are then determined so that the faces of corresponding pads and zones can come into contact during the step of melting the contact zone S.

The horizontal dimensions of the contact pad P2 are determined by those of the ridge of the photodiode which are themselves determined by the intended intrinsic cutoff frequency. For example, in order to operate at 40 Gbit/s, the length of the ridge (in the wave propagation direction in the structure) should be about 20 $\mu$m for a width of about 5 $\mu$m. To provide for positioning tolerance, the horizontal dimensions of the contact zone Z2 should be selected to be slightly greater than those of the ridge. The same horizontal dimensions can be adopted for the other pads and zones that carry the second contact pad and contact zone structures, respectively.

The horizontal dimensions of the contact pads P1 and P'1 and of the contact zones Z1 and Z'1 respectively carrying the first contact pad and contact zone structures need to comply with the following rules. The area of each contact pad must firstly be greater than that of the corresponding contact zone so as to establish mutual attraction when the solder joining them melts. Thereafter, it is necessary for the areas of the contact pads and the contact zones, and/or the numbers thereof, to be sufficient to create a resultant force of attraction between the component and the base which is strong enough to perform bonding between the other contact pads and contact zones by thermal compression.

Thus, in the example of a photodiode having a ridge with an area of 100 $\mu m^2$, the contact zones Z1 and Z'1 may be square in shape with sides that are 100 $\mu m$ long, while the contact pads P1 and P'1 are also square, having sides that are 150 $\mu m$ long.

The fabrication method of the invention terminates with an assembly operation. This consists in pressing the component 1 against the base 2 by placing the corresponding contact pads and contact areas to face one another respectively, and by heating the component and the base to an assembly temperature that lies between the melting temperature of the bonding material S, i.e. the gold/tin solder alloy, and the melting temperature of the other bonding materials S1, S2, i.e. gold.

The gold/tin solder alloy melts at 280° C. whereas gold melts at above 1000° C., so it is possible to select an assembly temperature of about 340° C.

Thus, by heating the assembly to this temperature, the solder S melts and wets the entire area of the layer 5, taking up a flared shape as shown in FIG. 3, while simultaneously exerting a force of attraction between the contact pad P1 and the contact zone Z1.

Naturally, the above-described case of a photodiode is merely one example of how the method of the invention can be applied. The invention can also apply to numerous other types of component, and in particular to those that are intended to operate at very high frequency and that consequently require at least one electrode of small area.

Typically, for a photodiode that is to operate at 10 Gbit/s, the contact pad P2 having the second contact pad structure should present a contact area of less than 1000 $\mu m^2$ approximately. For data rates above 40 Gbit/s, this contact area should be less than about 150 $\mu m^2$ approximately.

Similarly, the materials constituting the layers forming the contact pads and the contact zones are non-limiting examples of how the invention can be implemented.

In general, in the method of the invention, the important point is that the material constituting the solder layer S can melt at a temperature which is lower than the melting temperatures of the materials constituting the layers S1 and S2. These layers S1 and S2 constituting the second bonding materials need to be selected so as to be capable of being bonded together directly by thermal compression at an assembly temperature lying between the melting temperature of the first bonding material S and the melting temperature of the second bonding materials S1 and S2. These conditions are complied with well by an alloy based on gold and on tin for the first bonding material and by gold for the second bonding materials.

What is claimed is:

1. A method of fabricating an electronic or optoelectronic module comprising an active component mounted on a base, a face of the component being provided with a plurality of contact pads designed to co-operate with corresponding contact zones disposed on a face of the base, at least one contact pad of the component having a first vertical contact pad structure designed to be bonded by means of a first bonding material to a corresponding contact zone of the base that has a first vertical contact zone structure, the method comprising:

providing at least one other contact pad of the component with a second vertical contact pad structure and providing a corresponding contact zone of the base having a second vertical contact zone structure for bonding to said second vertical contact pad structure, the contact pad(s) and the contact zone(s) having said second vertical contact pad and contact zone structures respectively being coated in second bonding materials each having a melting temperature higher than the melting temperature of the first bonding material, said second materials being bonded together directly by thermal compression at an assembly temperature lying between the melting temperatures of the first and second bonding materials, the contact pad(s) and the contact zone(s) having the first vertical contact pad and contact zone structures respectively having dimensions such that, when they are bonded together by melting said first bonding material at said assembly temperature, a mutual force of attraction results between the component and the base for bonding together by thermal compression the contact pad and the contact zone respectively having the second vertical contact pad and contact zone structures;

pressing the component against the base by placing said plurality of contact pads and said corresponding contact zones face to face; and heating the component and the base to said assembly temperature.

2. A method according to claim 1, characterized in that at least one other pad and one other corresponding zone respectively having second vertical contact pad and corresponding contact zone structures perform only a function of positioning the component relative to the base.

3. A method according to claim 2, characterized in that the pads having said second vertical contact pad structure present identical contact areas.

4. A method according to claim 1, characterized in that at least one pad and at least one corresponding zone having respective first vertical contact pad and contact zone structures serve only to provide a mutual attraction function between the component and the base.

5. A method according to claim 1, characterized in that said first bonding material is an alloy based on gold and tin.

6. A method according to claim 1, characterized in that said second bonding materials both comprise gold.

7. An assembly method according to claim 1, characterized in that said contact pad having said second vertical contact pad structure of the component presents a contact area of less than 1000 $\mu m^2$.

8. An assembly method according to claim 7, characterized in that said contact pad having said second vertical contact pad structure of the component presents a contact surface area of less than 150 $\mu m^2$.

9. An electronic or optoelectronic module comprising an active component mounted on a base, one face of the component being provided with a plurality of contact pads co-operating with corresponding contact zones disposed on one face of the base, at least one contact pad of the component having a first vertical contact pad structure being bonded by means of a first bonding material to a corresponding contact zone of the base having a first vertical contact zone structure, the module being characterized in that at least one other contact pad of the component having an electrical function has a second vertical contact pad structure and is bonded to a corresponding contact zone of the base having a second vertical contact zone structure, the contact pad(s) and the contact zone(s) having respectively said second vertical contact pad and contact zone structures being coated with respective second bonding materials each having a melting temperature higher than the melting temperature of the first bonding material, the second materials being suitable for being bonded together directly by thermal compression at an assembly temperature lying between the melting temperature of the first bonding material and the melting temperatures of the second bonding materials, the contact pad(s) and the contact zone(s) respectively having the first vertical contact pad and contact zone structures having dimensions such that, when they are bonded together by melting said first bonding material at said assembly temperature, a mutual force of attraction results between the component and the base which causes the contact pad(s) and the contact zone(s) respectively having the second vertical contact pad and contact zone structures to be bonded together by thermal compression.

10. A module according to claim 9, characterized in that said active component is an optoelectronic component of the photodiode type, or an electro-absorption electro-optical modulator, or a laser source having direct modulation control.

\* \* \* \* \*